US012763753B2

(12) United States Patent
Tani

(10) Patent No.: US 12,763,753 B2
(45) Date of Patent: Oct. 13, 2026

(54) COMPOSITE SUBSTRATE AND METHOD OF PRODUCING COMPOSITE SUBSTRATE

(71) Applicant: NGK Insulators, Ltd., Nagoya-City (JP)

(72) Inventor: Minori Tani, Nagoya-City (JP)

(73) Assignee: NGK INSULATORS, LTD., Nagoya-City (JP)

( * ) Notice: Subject to any disclaimer, the term of this patent is extended or adjusted under 35 U.S.C. 154(b) by 1094 days.

(21) Appl. No.: 17/818,040

(22) Filed: Aug. 8, 2022

(65) Prior Publication Data

US 2022/0399872 A1 Dec. 15, 2022

Related U.S. Application Data

(63) Continuation of application No. PCT/JP2022/006547, filed on Feb. 18, 2022.

(30) Foreign Application Priority Data

Jun. 11, 2021 (JP) ................................ 2021-097962

(51) Int. Cl.

| | |
|---|---|
| ***H03H 9/00*** | (2006.01) |
| ***H03H 3/08*** | (2006.01) |
| ***H03H 9/02*** | (2006.01) |
| ***H10N 30/086*** | (2023.01) |

(52) U.S. Cl.

CPC .......... *H03H 9/02574* (2013.01); *H03H 3/08* (2013.01); *H03H 9/02559* (2013.01); *H10N 30/086* (2023.02)

(58) Field of Classification Search

CPC .. H03H 9/02574; H03H 3/08; H03H 9/02559; H03H 9/02622; H03H 9/25; H10N 30/086; H10N 30/073; C30B 33/06; H01L 21/02

See application file for complete search history.

(56) References Cited

U.S. PATENT DOCUMENTS

| | | | |
|---|---|---|---|
| 5,759,753 | A | 6/1998 | Namba et al. |
| 5,982,010 | A | 11/1999 | Namba et al. |
| 6,004,860 | A | 12/1999 | Ogawa et al. |
| 6,716,722 | B1 | 4/2004 | Furihata et al. |
| 8,866,365 | B2 | 10/2014 | Hori et al. |
| 10,566,518 | B2 | 2/2020 | Nagae et al. |

(Continued)

FOREIGN PATENT DOCUMENTS

| | | | |
|---|---|---|---|
| DE | 696 15 959 | T2 | 4/2002 |
| JP | H08-274285 | A | 10/1996 |

(Continued)

OTHER PUBLICATIONS

Extended European Search Report dated Jun. 27, 2024 (Application No. 22751240.7).

(Continued)

*Primary Examiner* — Julio C. Gonzalez

(74) *Attorney, Agent, or Firm* — Muncy, Geissler, Olds & Lowe, P.C.

(57) ABSTRACT

A composite substrate according to includes: a support substrate; and a piezoelectric layer arranged on one side of the support substrate, wherein an amplitude of a waviness having a spatial frequency of more than 0.045 cyc/mm according to a shape of the support substrate is 10 nm or less.

8 Claims, 8 Drawing Sheets

(56) References Cited

U.S. PATENT DOCUMENTS

| | | | |
|---|---|---|---|
| 10,965,268 | B2 | 3/2021 | Hori et al. |
| 11,165,408 | B2 * | 11/2021 | Abatake ............. B23K 26/0006 |
| 2004/0081805 | A1 | 4/2004 | Furihata et al. |
| 2010/0244196 | A1 * | 9/2010 | Yoshida .................. C30B 25/18 438/455 |
| 2011/0207241 | A1 | 8/2011 | Tomisaka et al. |
| 2014/0145558 | A1 | 5/2014 | Hori et al. |
| 2017/0170385 | A1 * | 6/2017 | Nagae .................. H10N 30/086 |
| 2018/0047890 | A1 | 2/2018 | Watanabe |
| 2019/0044494 | A1 | 2/2019 | Abatake et al. |
| 2021/0006224 | A1 | 1/2021 | Hori et al. |
| 2021/0111332 | A1 | 4/2021 | Uno et al. |

FOREIGN PATENT DOCUMENTS

| | | | |
|---|---|---|---|
| JP | H09-092895 | A | 4/1997 |
| JP | 2001-085648 | A | 3/2001 |
| JP | 2004-214505 | A | 7/2004 |
| JP | 2019-029941 | A | 2/2019 |
| JP | 2020-150488 | A | 9/2020 |
| KR | 10-2014-0043457 | A | 4/2014 |
| KR | 10-2017-0139489 | A | 12/2017 |
| WO | 2016/158965 | A1 | 10/2016 |
| WO | 2017/047605 | A1 | 3/2017 |
| WO | 2019/181087 | A1 | 9/2019 |
| WO | 2019/244471 | A1 | 12/2019 |
| WO | 2020/189115 | A1 | 9/2020 |

OTHER PUBLICATIONS

Korean Office Action (with English translation) dated Apr. 30, 2024 (Application No. 10-2022-7024425).

Japanese Office Action (Application No. 2022-078984) dated Sep. 3, 2024 (with English translation) (11 pages).

Japanese Office Action (Application No. 2021-097962) dated Sep. 14, 2021 (with English translation).

Japanese Office Action (Application No. 2021-097962) dated Dec. 21, 2021 (with English translation).

International Search Report and Written Opinion (Application No. PCT/JP2022/006547) dated Apr. 5, 2022.

English translation of the International Search Report dated Apr. 5, 2022 (Application No. PCT/JP2022/006547).

Taiwanese Office Action dated Jul. 3, 2025 (Application No. 111111277).

English translation of the International Preliminary Report on Patentability (Chapter I) dated Dec. 21, 2023 (Application No. PCT/JP2022/006547).

* cited by examiner

COMPOSITE SUBSTRATE AND METHOD OF PRODUCING COMPOSITE SUBSTRATE

CROSS-REFERENCE TO RELATED APPLICATIONS

This application is a continuation under 35 U.S.C. 120 of International Application PCT/JP2022/006547 having the International Filing Date of Feb. 18, 2022, and having the benefit of the earlier filing date of Japanese Application No. 2021-097962, filed on Jun. 11, 2021. Each of the identified applications is fully incorporated herein by reference.

BACKGROUND OF THE INVENTION

Technical Field

The present invention relates to a composite substrate and a method of producing a composite substrate.

Background Art

For example, a filter utilizing a surface acoustic wave (SAW filter) has been used in a communication device such as a cellular phone for extracting an electric signal having any appropriate frequency. The SAW filter has a structure in which an electrode or the like is formed on a composite substrate having a piezoelectric layer (see, for example, Japanese Patent Application Laid-open No. 2020-150488).

SUMMARY OF THE INVENTION

In recent years, in the field of an information communication device, for example, communication traffic has been rapidly increasing, and hence an improvement in performance of the SAW filter has been required.

A primary object of the present invention is to provide a composite substrate that can contribute to an improvement in performance of a SAW filter.

According to one embodiment of the present invention, there is provided a composite substrate, including: a support substrate; and a piezoelectric layer arranged on one side of the support substrate, wherein an amplitude of a waviness having a spatial frequency of more than 0.045 cyc/mm according to a shape of the support substrate is 10 nm or less.

In one embodiment, a difference between a thickness T1 of the piezoelectric layer at a first point and a thickness T2 thereof at a second point has an absolute value of 100 nm or less.

In one embodiment, the piezoelectric layer has a thickness of 5 μm or less.

According to another embodiment of the present invention, there is provided a surface acoustic wave element, including the above-mentioned composite substrate.

According to still another embodiment of the present invention, there is provided a method of producing a composite substrate, including: joining a support substrate to a first main surface side of a piezoelectric substrate having a first main surface and a second main surface facing each other; and polishing a surface of the piezoelectric substrate on a second main surface side thereof, wherein an amplitude of a waviness having a spatial frequency of more than 0.045 cyc/mm according to a shape of the support substrate is 10 nm or less.

In one embodiment, a difference between a thickness T1 of a piezoelectric layer, which is obtained by polishing the piezoelectric substrate, at a first point and a thickness T2 thereof at a second point has an absolute value of 100 nm or less.

In one embodiment, a piezoelectric layer, which is obtained by polishing the piezoelectric substrate, has a thickness of 5 μm or less.

Advantageous Effects of Invention

According to the embodiment of the present invention, for example, the composite substrate that can contribute to an improvement in performance of a SAW filter can be provided.

DETAILED DESCRIPTION OF THE INVENTION

Embodiments of the present invention are described below, with reference to the drawings. However, the present invention is not limited to those embodiments. In addition, the drawings may be schematically illustrated in terms of, for example, the width, thickness, and shape of each portion as compared to the embodiments for further making the description clear. However, the drawings are merely examples, and do not limit the interpretation of the present invention.

A. Composite Substrate

Figure 1:
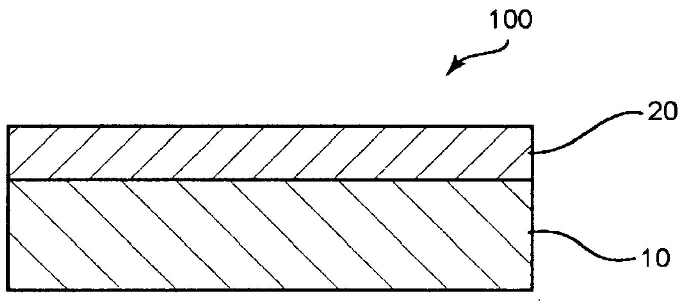
FIG. 1 is a schematic sectional view for illustrating the schematic configuration of a composite substrate according to one embodiment of the present invention.

FIG. 1 is a schematic sectional view for illustrating the schematic configuration of a composite substrate according to one embodiment of the present invention. A composite substrate 100 includes a support substrate 10 and a piezoelectric layer 20 arranged on one side of the support substrate 10. The composite substrate 100 may further include any appropriate layer (not shown). The kinds, functions, number, combination, arrangement, and the like of such layers may be appropriately determined in accordance with purposes. For example, the composite substrate 100 may include an intermediate layer (e.g., an inorganic material layer) arranged between the piezoelectric layer 20 and the support substrate 10. In addition, for example, the composite substrate 100 may include a joining layer arranged between the piezoelectric layer 20 or the intermediate layer (not shown) and the support substrate 10.

Figure 2:
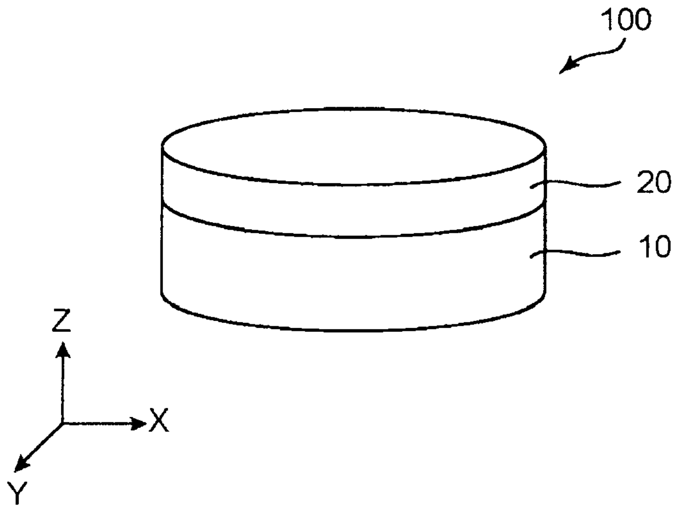
FIG. 2 is a view for illustrating an example of the appearance of the composite substrate.

The composite substrate 100 may be produced in any appropriate shape. In one embodiment, the substrate may be produced in the form of a so-called wafer as illustrated in FIG. 2. The size of the composite substrate 100 may be appropriately set in accordance with purposes. For example, the diameter of the wafer is from 50 mm to 150 mm.

A-1. Support Substrate

Any appropriate thickness may be adopted as the thickness of the support substrate 10. The thickness of the support substrate is, for example, from 100 μm to 1,000 μm.

The amplitude of the waviness of the shape of the support substrate having a spatial frequency of more than 0.045 cyc/mm is 0 nm or more and 10 nm or less, preferably 5 nm or less. The use of such support substrate can satisfactorily achieve the thickness accuracy of the piezoelectric layer to be described later.

Any appropriate substrate may be used as the support substrate. The support substrate may include a single crystalline substance or may include a polycrystalline substance. A material for forming the support substrate is preferably selected from: silicon; sapphire; glass; quartz; crystal; and alumina.

The silicon may be single crystalline silicon, polycrystalline silicon, or high-resistance silicon.

Typically, the sapphire is a single crystalline substance having the composition of $Al_2O_3$, and the alumina is a polycrystalline substance having the composition of $Al_2O_3$.

The thermal expansion coefficient of the material for forming the support substrate is preferably smaller than the thermal expansion coefficient of a material for forming the piezoelectric layer to be described later. Such support substrate can suppress changes in shape and size of the piezoelectric layer at the time of a temperature change, and hence can suppress, for example, a change in frequency characteristic of a surface acoustic wave element to be obtained.

A-2. Piezoelectric Layer

Any appropriate piezoelectric material may be used as the material for forming the piezoelectric layer. A single crystal having the composition of $LiAO_3$ is preferably used as the piezoelectric material. Herein, A represents one or more kinds of elements selected from: niobium; and tantalum. Specifically, $LiAO_3$ may be lithium niobate ($LiNbO_3$), lithium tantalate ($LiTaO_3$), or a lithium niobate-lithium tantalate solid solution.

When the piezoelectric material is lithium tantalate, a layer whose normal direction is rotated about X-axis of the piezoelectric material, which is the direction in which a surface acoustic wave propagates, from Y-axis thereof to Z-axis thereof by from 32° to 55° (e.g., 42°), that is, is a direction represented as (180°, 58° to 35°, 180°) in Euler angle notation is preferably used as the piezoelectric layer because a propagation loss is small.

When the piezoelectric material is lithium niobate, for example, a layer whose normal direction is rotated about X-axis of the piezoelectric material, which is the direction in which a surface acoustic wave propagates, from Z-axis thereof to −Y-axis thereof by 37.8°, that is, is a direction represented as (0°, 37.8°, 0°) in Euler angle notation is preferably used as the piezoelectric layer because an electromechanical coupling coefficient is large. In addition, for example, when the piezoelectric material is lithium niobate, a layer whose normal direction is rotated about X-axis of the piezoelectric material, which is the direction in which a surface acoustic wave propagates, from Y-axis thereof to Z-axis thereof by from 40° to 65°, that is, is a direction represented as (180°, 50° to 25°, 180°) in Euler angle notation is preferably used as the piezoelectric layer because a high sound velocity is obtained.

The thickness of the piezoelectric layer is preferably 5 μm or less, more preferably 3 μm or less, still more preferably 1 μm or less. Meanwhile, the thickness of the piezoelectric layer is, for example, 0.2 μm or more. Such thickness can provide a high-performance surface acoustic wave element. Specifically, such effects as described below are expected: the temperature characteristic (TCF) of the element can be improved; and the Q-value thereof can be improved.

Figure 3A:
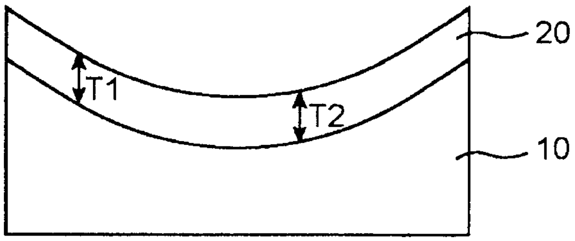
FIG. 3A is a view for illustrating an example of the outline of the shape of a support substrate and the shape of a piezoelectric layer.
Figure 3B:
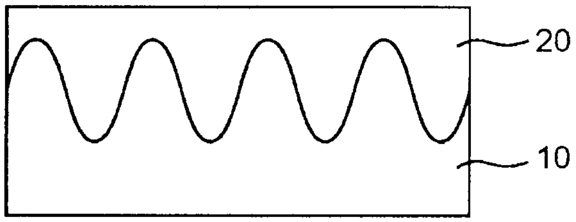
FIG. 3B is a view for illustrating another example of the outline of the shape of the support substrate and the shape of the piezoelectric layer.

The thickness of the piezoelectric layer is preferably uniform. FIG. 3A and FIG. 3B are each a view for illustrating an example of the outline of the shape of the support substrate (in, for example, its X-axis direction) and the shape of the piezoelectric layer. When the waviness frequency of the support substrate 10 is low (e.g., when the spatial frequency thereof is 0.045 cyc/mm or less) as illustrated in FIG. 3A, the shape of the piezoelectric layer 20 can be easily caused to correspond to the waviness of the support substrate 10, and hence the thickness accuracy of the piezoelectric layer 20 may be excellent. For example, the absolute value of a difference between the thickness (first thickness) T1 of the piezoelectric layer 20 at a first point in its X-axis direction and the thickness (second thickness) T2 of the piezoelectric layer at a second point therein is preferably 100 nm or less, more preferably 50 nm or less. When the layer has such thickness accuracy, a high-performance surface acoustic wave element can be obtained. Specifically, such an effect as described below is expected: the Q-value of the element can be improved. In addition, a surface acoustic wave element reduced in characteristic variation can be obtained. When the waviness frequency of the support substrate 10 is high (e.g., when the spatial frequency thereof is more than 0.045 cyc/mm) as illustrated in FIG. 3B, it tends to be difficult to cause the shape of the piezoelectric layer 20 to correspond to the waviness of the support substrate 10. However, when the above-mentioned amplitude of the waviness of the support substrate is satisfied, the thickness accuracy of the piezoelectric layer 20 may be excellent.

A-3. Others

As described above, the composite substrate may include the intermediate layer. A material for forming the intermediate layer is, for example, silicon oxide, hafnium oxide, tantalum oxide, zirconium oxide, or aluminum oxide. The thickness of the intermediate layer is, for example, from 0.1 μm to 2 μm.

The intermediate layer may be formed by any appropriate method. The layer may be formed by, for example, physical vapor deposition, such as sputtering or ion beam-assisted deposition (IAD), chemical vapor deposition, or an atomic layer deposition (ALD) method.

In addition, as described above, the composite substrate may include the joining layer. A material for forming the joining layer is, for example, a silicon oxide, silicon, tantalum oxide, niobium oxide, aluminum oxide, titanium oxide, or hafnium oxide. The thickness of the joining layer is, for example, from 0.005 μm to 1 μm.

The joining layer may be formed by any appropriate method. Specifically, the layer may be formed by the same method as the above-mentioned method of forming the intermediate layer.

A-4. Production Method

A method of producing a composite substrate according to one embodiment of the present invention includes: joining a support substrate to the first main surface side of a piezoelectric substrate having a first main surface and a second main surface facing each other; and polishing the surface of the piezoelectric substrate on its second main surface side. The polishing is typically performed after the joining.

FIG. 4A to FIG. 4D are views for illustrating an example of a production process for the composite substrate according to one embodiment.

Figure 4A:
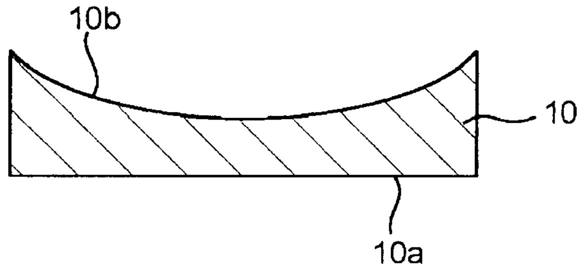
FIG. 4A is a view for illustrating an example of a production process for the composite substrate according to one embodiment.

FIG. 4A is an illustration of a state in which the polishing of both the main surfaces of the support substrate 10 facing each other is completed. In the example illustrated in FIG. 4A, the lower surface 10*a* of the support substrate 10 is polished to be flat, and the upper surface 10*b* thereof shows a curved shape that is convex downward. The amplitude of the waviness of the shape of the support substrate 10 having a spatial frequency of more than 0.045 cyc/mm is 0 nm or more and 10 nm or less, preferably 5 nm or less. Such value may be satisfactorily achieved by, for example, the shape of the illustrated example. The upper surface 10*b* may show a curved shape that is convex upward (not shown).

Figure 4B:
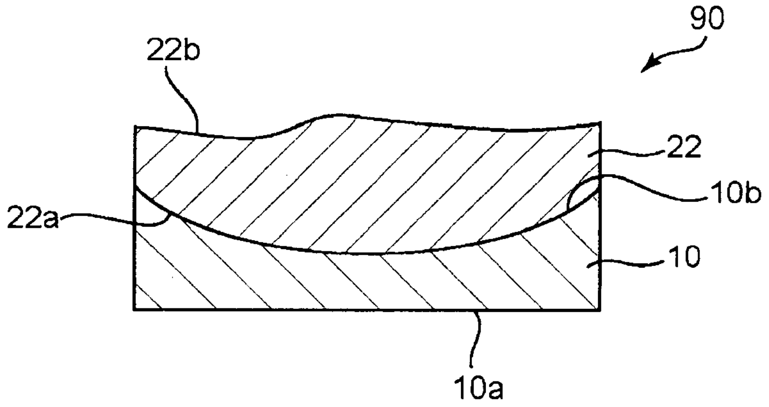
FIG. 4B is a view subsequent to FIG. 4A.

FIG. 4B is an illustration of a state in which the support substrate 10 and a piezoelectric substrate 22 are directly joined. The piezoelectric substrate 22 has a first main surface 22*a* and a second main surface 22*b* facing each other, and is joined to the support substrate 10 after the polishing of the first main surface 22*a*. At the time of the direct joining, the joining surfaces of the substrates are preferably activated by any appropriate activation treatment. The direct joining is performed by, for example, activating the upper surface 10*b* of the support substrate 10, activating the first main surface 22*a* of the piezoelectric substrate 22, then bringing the activated surface of the support substrate 10 and the activated surface of the piezoelectric substrate 22 into contact with each other, and pressurizing the resultant. Thus, a joined body 90 illustrated in FIG. 4B is obtained.

Figure 4C:
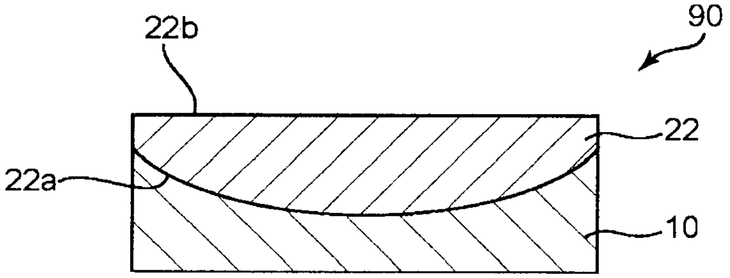
FIG. 4C is a view subsequent to FIG. 4B.
Figure 4D:
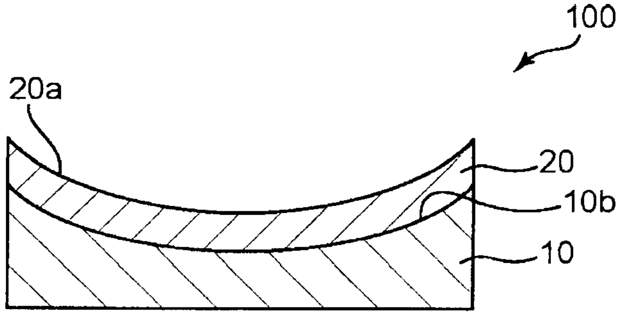
FIG. 4D is a view subsequent to FIG. 4C.

The second main surface 22*b* of the piezoelectric substrate 22 of the resultant joined body 90 is subjected to processing, such as grinding or polishing, so that a piezoelectric layer having the above-mentioned desired thickness may be obtained. FIG. 4C is an illustration of a state in which the grinding of the second main surface 22*b* is completed, and FIG. 4D is an illustration of a state in which the polishing of the second main surface 22*b* is completed. The piezoelectric layer 20 is formed by the polishing, and hence the composite substrate 100 is obtained. The shape of the upper surface 20*a* of the piezoelectric layer 20 may correspond to, for example, the shape of the upper surface 10*b* of the support substrate 10.

A method for the polishing is, for example, mirror polishing based on chemical-mechanical polishing (CMP), lap polishing, or the like. Of those, chemical-mechanical polishing is preferably adopted. Specifically, chemical-mechanical polishing based on a polishing pad, the polishing including using polishing slurry (e.g., colloidal silica), is adopted.

At the time of the joining, the surface of each layer is preferably washed for, for example, removing the residue of a polishing agent, a work-affected layer, or the like. A method for the washing is, for example, wet washing, dry washing, or scrub washing. Of those, the scrub washing is preferred because the surface can be simply and efficiently washed. A specific example of the scrub washing is a method including washing the surface in a scrub washing machine with a detergent (e.g., a SUNWASH series manufactured by Lion Corporation) and then with a solvent (e.g., a mixed solution of acetone and isopropyl alcohol (IPA)).

The activation treatment is typically performed by irradiating the joining surface with a neutralized beam. The activation treatment is preferably performed by generating the neutralized beam with an apparatus such as an apparatus described in JP 2014-086400 A, and irradiating the joining surface with the beam. Specifically, a saddle-field fast atomic beam source is used as a beam source, and an inert gas, such as argon or nitrogen, is introduced into the chamber of the apparatus, followed by the application of a high voltage from the DC power source thereof to an electrode thereof. Thus, a saddle-field electric field is generated between the electrode (positive electrode) and the casing (negative electrode) thereof to cause electron motion, to thereby generate the beams of an atom and an ion by the inert gas. Of the beams that have reached the grid of the fast atomic beam source, an ion beam is neutralized by the grid, and hence the beam of a neutral atom is emitted from the fast atomic beam source. The voltage at the time of the activation treatment by the beam irradiation is preferably set to from 0.5 kV to 2.0 kV, and a current at the time of the activation treatment by the beam irradiation is preferably set to from 50 mA to 200 mA.

The joining surfaces are preferably brought into contact with each other and pressurized in a vacuum atmosphere. A temperature at this time is typically normal temperature. Specifically, the temperature is preferably 20° C. or more and 40° C. or less, more preferably 25° C. or more and 30° C. or less. A pressure to be applied is preferably from 100 N to 20,000 N.

B. Surface Acoustic Wave Element

A surface acoustic wave element according to an embodiment of the present invention includes the above-mentioned composite substrate. The surface acoustic wave element typically includes the composite substrate and electrodes (interdigital transducers) arranged on the piezoelectric layer side of the composite substrate. Such surface acoustic wave element is suitably used as, for example, a SAW filter in a communication device such as a cellular phone.

EXAMPLES

Now, the present invention is specifically described by way of Examples. However, the present invention is not limited by these Examples.

Example

A lithium tantalate (LT) substrate having a diameter of 4 inches and a thickness of 500 μm (such a 42° Y-cut X-propagation LT substrate that the direction in which a surface acoustic wave (SAW) propagated was represented by X, the substrate being a rotated Y-cut plate having a cut-out angle of 42°) was prepared.

In addition, a silicon substrate having a diameter of 4 inches and a thickness of 500 μm was prepared, and the surfaces (both the surfaces) of the silicon substrate were polished. Specifically, the silicon substrate was placed on the SUS carrier of a CMP polishing machine, and both the surfaces were polished by using a hard urethane pad and by using colloidal silica as a polishing agent.

Next, the LT substrate and the silicon substrate were directly joined. Specifically, the surface of the LT substrate and the surface of the silicon substrate were washed, and then both the substrates were loaded into the vacuum chamber of the apparatus, followed by its evacuation to a vacuum of the order of $10^{-6}$ Pa. After that, the surfaces of both the substrates were irradiated with fast atomic beams (acceleration voltage: 1 kV, Ar flow rate: 27 sccm) for 80 seconds. After the irradiation, the beam-irradiated surfaces of both the substrates were superimposed on each other, and both the substrates were joined by being pressurized at 1,200 kgf for 2 minutes. Thus, a joined body was obtained.

Next, the rear surface of the LT substrate of the joined body (composite substrate) was ground with a grinder processing machine until its thickness was reduced from its initial value, that is, 500 μm to 3 μm. Further, the rear surface was subjected to mirror polishing in a CMP polishing machine by using a hard urethane pad and by using colloidal silica as a polishing agent until the thickness became 1 μm. Thus, a composite substrate including the silicon substrate and a LT layer was obtained.

Comparative Example

A composite substrate was obtained in the same manner as in Example except that a nonwoven fabric was used instead of the hard urethane pad at the time of the polishing of both the surfaces of the silicon substrate.

Evaluation

Example and Comparative Example described above were each subjected to the following evaluations.

1. Measurement of Flatness (Shape) and Thickness (Thickness Distribution)

The flatness of the silicon substrate after the polishing of both the surfaces in its X-axis direction was measured with a slating incidence interference method flatness tester ("FT-17" manufactured by NIDEK Co., Ltd.). In addition, the thickness of the LT layer of the resultant composite substrate in the X-axis direction was measured with a microspectroscopic thickness meter ("OPTM" manufactured by Otsuka Electronics Co., Ltd.). Specifically, the thickness was measured at 32 points in the range of from −43.4 mm to +43.4 mm when the center of the composite substrate serving as a wafer was defined as an origin at pitches of 2.8 mm.

Figure 5A:
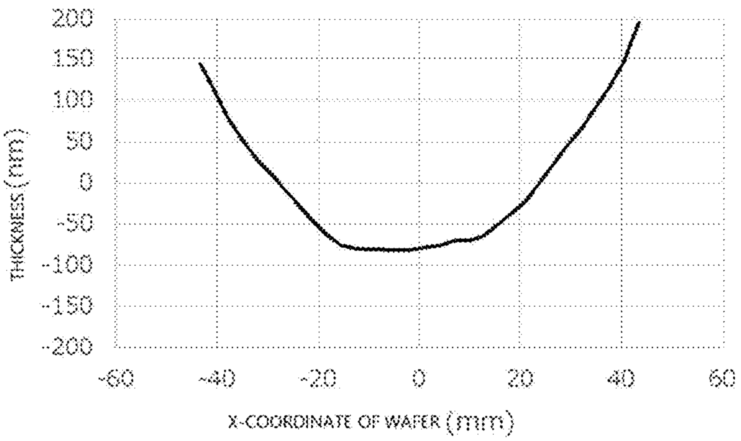
FIG. 5A is a graph for showing the shape of the silicon substrate of Example.
Figure 5B:
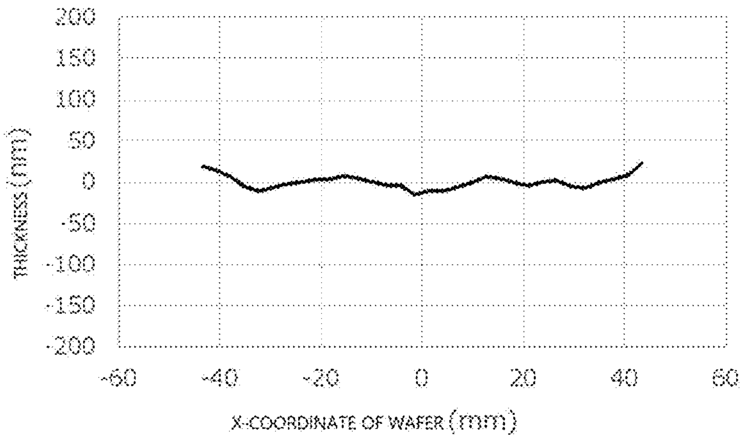
FIG. 5B is a graph for showing the thickness distribution of the LT layer of Example.
Figure 6A:
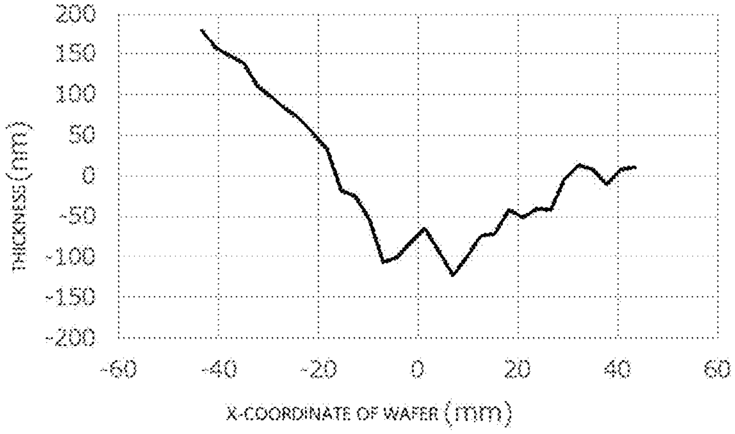
FIG. 6A is a graph for showing the shape of the silicon substrate of Comparative Example.
Figure 6B:
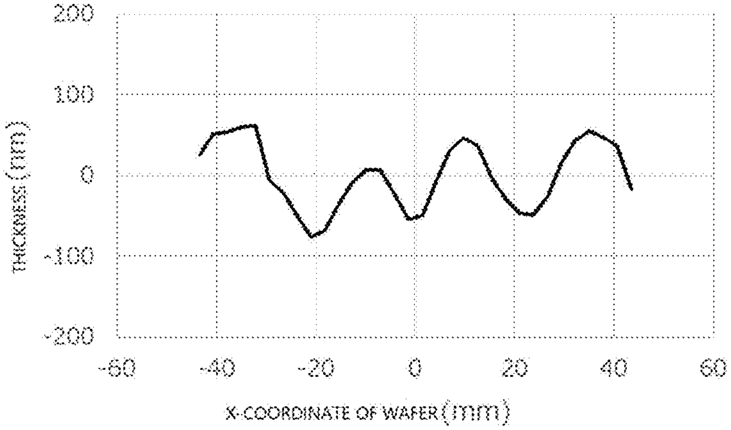
FIG. 6B is a graph for showing the thickness distribution of the LT layer of Comparative Example.

The results of the silicon substrate of Example are shown in FIG. 5A, and the results of the LT layer of Example are shown in FIG. 5B. In addition, the results of the silicon substrate of Comparative Example are shown in FIG. 6A, and the results of the LT layer of Comparative Example are shown in FIG. 6B. In each of the graphs shown in FIG. 5A and FIG. 5B, and FIG. 6A and FIG. 6B, values obtained by subtracting the average of the thickness of the substrate or the layer from the measured values are shown.

2. Fast Fourier Transform (FFT) Analysis

The results obtained in the above-mentioned section 1 were subjected to FFT analysis. Specifically, each of the shapes and the thickness distributions obtained in the above-mentioned section 1 was multiplied by a Hanning window serving as a window function, and was subjected to the FFT analysis. At the time of the calculation, the analysis tool of Microsoft Excel was used after a tilt component and a DC component had been removed. For FFT conversion and amplitude calculation, each of the resultant absolute values was divided by 16 (number of data points, that is, 32/2), and was then doubled in consideration of the influence of the processing with the Hanning window.

When the silicon substrate was a shape that was convex downward (toward the side on which the LT substrate was not arranged), an unnecessary frequency component occurred at the time of the multiplication of the Hanning window. Accordingly, in order for the silicon substrate to be a shape that was convex upward, the calculation was performed after the respective data had been inverted by subtracting the data from the maximum.

Figure 5C:
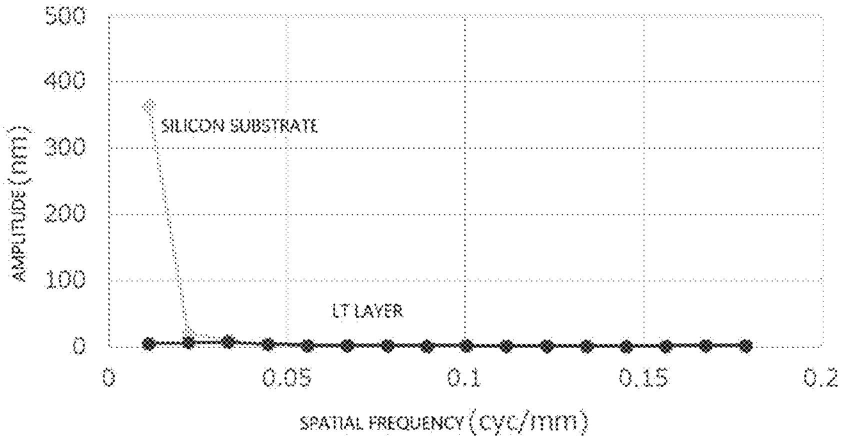
FIG. 5C is a graph for showing the FFT analysis results of the shape of the silicon substrate of Example and the thickness distribution of the LT layer thereof.
Figure 5D:
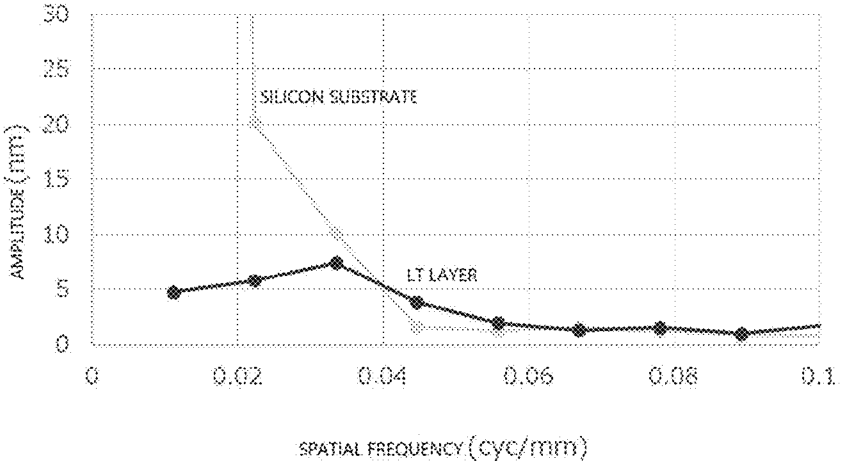
FIG. 5D is a graph for showing the axis of ordinate and axis of abscissa of FIG. 5C in an enlarged manner.
Figure 6C:
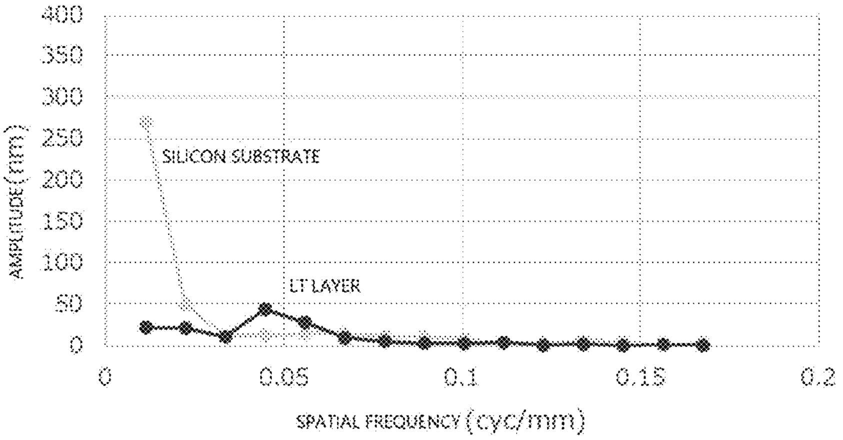
FIG. 6C is a graph for showing the FFT analysis results of the shape of the silicon substrate of Comparative Example and the thickness distribution of the LT layer thereof.
Figure 6D:
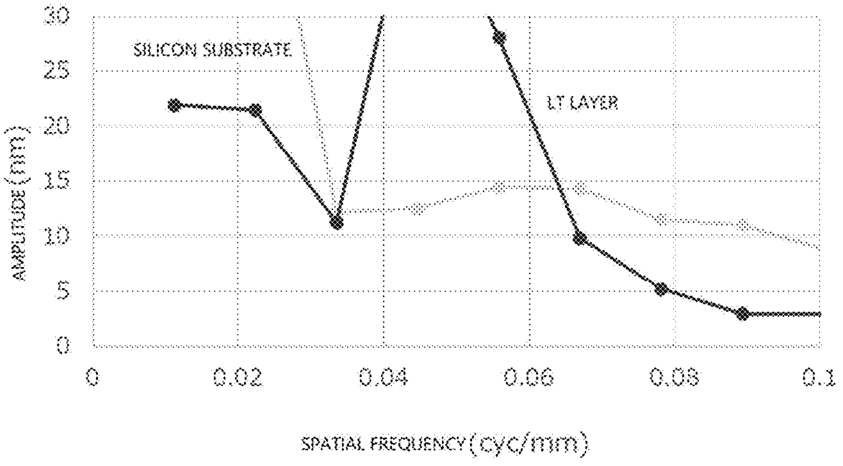
FIG. 6D is a graph for showing the axis of ordinate and axis of abscissa of FIG. 6C in an enlarged manner.

The results of Example are shown in FIG. 5C and FIG. 5D, and the results of Comparative Example are shown in FIG. 6C and FIG. 6D.

As shown in FIG. 5B, it is found that in Example, the composite substrate excellent in thickness accuracy of its LT layer is obtained.

INDUSTRIAL APPLICABILITY

Typically, the composite substrate according to the embodiment of the present invention may be suitably used in a surface acoustic wave element.

What is claimed is:

1. A composite substrate, comprising:
- a support substrate; and
- a piezoelectric layer arranged on one side of the support substrate,
- wherein an amplitude of waviness of a shape of the support substrate at a spatial frequency of more than 0.045 cyc/mm is 10 nm or less.

2. The composite substrate according to claim 1, wherein a difference between a thickness T1 of the piezoelectric layer at a first point and a thickness T2 thereof at a second point has an absolute value of 100 nm or less.

3. The composite substrate according to claim 1, wherein the piezoelectric layer has a thickness of 5 μm or less.

4. A method of producing a composite substrate, comprising:
- joining a support substrate to a first main surface side of a piezoelectric substrate having a first main surface and a second main surface facing each other; and
- polishing a surface of the piezoelectric substrate on a second main surface side thereof,
- wherein an amplitude of waviness of a shape of the support substrate at a spatial frequency of more than 0.045 cyc/mm is 10 nm or less.

5. The production method according to claim 4, wherein a difference between a thickness T1 of a piezoelectric layer, which is obtained by polishing the piezoelectric substrate, at a first point and a thickness T2 thereof at a second point has an absolute value of 100 nm or less.

6. The production method according to claim 4, wherein a piezoelectric layer, which is obtained by polishing the piezoelectric substrate, has a thickness of 5 μm or less.

7. The composite substrate according to claim 2, wherein the piezoelectric layer has a thickness of 5 μm or less.

8. The production method according to claim 5, wherein the piezoelectric layer has a thickness of 5 μm or less.

* * * * *